(12) United States Patent
Kim et al.

(10) Patent No.: US 6,383,666 B1
(45) Date of Patent: May 7, 2002

(54) ORGANOMETALLIC COMPLEX AND ORGANIC ELECTROLUMINESCENT DEVICE USING THE SAME

(75) Inventors: Kongkyeom Kim; Sehwan Son; Okhee Kim; Seok-Hee Yoon, all of Taejeon; Hyo-Seok Kim, Taejon; Jaesoon Bae; Youn-Gu Lee, both of Seoul, all of (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 09/540,837

(22) Filed: Mar. 31, 2000

(30) Foreign Application Priority Data

Mar. 31, 1999 (KR) .............................. 99-11160

(51) Int. Cl.⁷ .................... C07D 215/00; C07D 417/00; C07D 221/00; C07D 401/00; H05B 33/12
(52) U.S. Cl. ...................... 428/690; 428/917; 428/704; 313/504; 313/506; 252/301.16; 546/26; 546/38; 546/101; 546/122; 546/157; 546/268.4; 546/270.1; 546/271.7; 546/273.1; 546/273.4; 546/276.7; 546/281.1; 549/275; 549/280; 549/283
(58) Field of Search ........................ 252/301.27, 301.28, 252/301.31, 301.32, 301.16; 428/690, 917, 704; 313/504, 506; 546/26, 38, 101, 122, 157, 268.4, 270.1, 271.7, 273.1, 273.4, 276.7, 281.1

(56) References Cited

U.S. PATENT DOCUMENTS

| | | |
|---|---|---|
| 3,892,750 A * | 7/1975 | Frey ............................ 260/270 |
| 5,150,006 A | 9/1992 | Van Slyke et al. |
| 5,366,611 A | 11/1994 | Higashi et al. |
| 5,458,977 A | 10/1995 | Hosokawa et al. |
| 5,466,392 A | 11/1995 | Hironaka et al. |
| 5,486,406 A | 1/1996 | Shi |
| 5,529,853 A | 6/1996 | Hamada et al. |
| 5,552,547 A | 9/1996 | Shi |
| 5,645,948 A | 7/1997 | Shi et al. |
| 5,779,937 A | 7/1998 | Sano et al. |
| 5,840,217 A | 11/1998 | Lupo et al. |

FOREIGN PATENT DOCUMENTS

| | | |
|---|---|---|
| EP | 0 700 917 A2 | 3/1996 |
| EP | 0 652 273 B1 | 2/1998 |

OTHER PUBLICATIONS

Applied Physics Letters, vol. 75, No. 1, Jul. 5, 1999. "Very High–Efficiency Green Organic Light–Emitting Devices Based on Electrophosphorescence".

* cited by examiner

Primary Examiner—Cynthia H. Kelly
Assistant Examiner—Ling Xu
(74) Attorney, Agent, or Firm—Knobbe Martens & Olson Bear LLP.

(57) ABSTRACT

Disclosed are new organometallic complex molecules having light-emitting and electron-transporting characteristics. Also disclosed is organic EL (electroluminescent) devices using these organometallic complex molecules as electron-transporting materials. The organometallic complex molecules are used to form a light-emitting layer with or without doping of another light-emitting material. The organometallic complex molecules can also be used in an electron-transporting layer of the organic EL device. The organic EL devices incorporating the organometallic complex molecules have high thermal stability.

40 Claims, 5 Drawing Sheets

ORGANOMETALLIC COMPLEX AND ORGANIC ELECTROLUMINESCENT DEVICE USING THE SAME

BACKGROUND OF THE INVENTION

The present invention generally relates to organic electroluminescence. More particularly, the present invention pertains to an organometallic complex molecule and an organic electroluminescent (hereinafter referred to as "organic EL") device using the organometallic complex molecule.

Organic electroluminescence is one of the instances, in which electric current is directly converted into visible light by internal processes of organic fluorescent or light-emitting molecules. In recent years, great attention has been given to the improvement of organic EL technology since it can be used in a new type of flat panel display, which can replace the liquid crystal display (LCD) technology. Individual colors of red, green is or blue can be emitted, or they can be combined to create fill color image display. This technology is advantageous over LCD technology in its low power consumption, faster response time, higher brightness level, unlimited viewing angle and tinner design.

A basic construction of an organic EL device includes two opposing electrodes, i.e., a cathode and an anode, and an intervening layer containing an organic light-emitting or fluorescent material. When applying an electric voltage between the electrodes, electrons and holes are injected from the cathode and the anode, respectively, into the intervening layer and recombined therein Recombined pairs of electrons and holes, namely excitons, move around carrying the energy generated by the recombination and transfer the energy to the organic fluorescent molecules. The transferred energy excites valence electrons of the organic fluorescent molecules and generate photons when the electrons return to their ground state.

In order to improve energy efficiency, multiple-layered organic EL devices have been suggested. Generally, multiple-layered organic EL devices have one or more of hole-injecting layer, hole-transporting layer, light-emitting layer, electron-transporting layer, and electron-injecting layer. The carrier (electron or hole) injecting layer or carrier transporting layer may work as a light emitting layer as well when organic fluorescent materials arc doped therein. Organic EL devices having multiple layers are expensive to manufacture due to the significant accompanying processing. Thus, it is desirable that one layer of the organic EL device has multiple functions: e.g., one for electron-injection/transportation as well as light-emission.

In order to improve luminescence efficiency of a light-emitting layer, another light-emitting material having a higher quantum yield is doped in the light-emitting layer. Excitons are known to have a tendency to transfer their energy to a material having a smaller band gap among materials near the recombination location. Accordingly, a dopant is selected from materials having a high quantum yield and a smaller band gap (larger wavelength) than the host material; otherwise, the excitons' energy will transferred the host material having a lower quantum yield, accordingly generating weak or no emission.

Tris (8-hydroxyquinoline) aluminum complex (Alq3) is known as a material having light-emitting and electron-injection/transportation properties. Alq3 has a band gap for green light emission. Accordingly, blue light-emitting materials are not suitable for doping in an Alq3 layer Although DPVBi and B-Alq emitting blue light can be used as an electron-transporting material, these materials require a high driving voltage when directly contacting the cathode because of their high reduction potentials. In order to use these materials in a light-emitting layer functioning as the electron-transporting as well, a separate electron-injection layer is needed.

SUMMARY OF THE INVENTION

One aspect of the present invention provides an organometallic complex for use in organic EL devices. The complex compounds have a structure satisfying the following Chemical Formula (1):

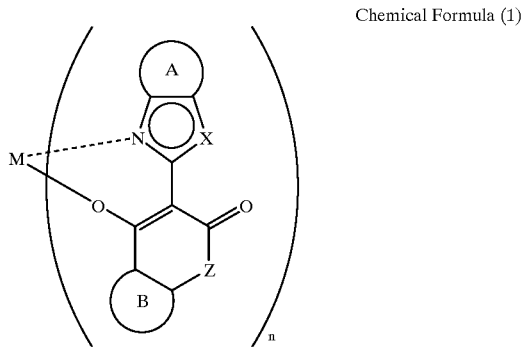

Chemical Formula (1)

In the Chemical Formula (1), "X" is, with or without a functional group bonded thereto, one selected from the group consisting of carbon, oxygen, sulfur, selenium, and nitrogen with an alkyl or aromatic functional group. "Z" is, with or without a functional group bonded thereto, one selected from the group consisting of carbon, oxygen, sulfur, selenium and nitrogen with an alkyl or aromatic functional group. "M" is a metal and preferably is a monovalent divalent or trivalent metal. "n" is a positive integer depending upon the oxidation state of the metal "M". "A" and "B" are functional groups comprising one or more ring structures. All the implicit hydrogens of Chemical Formula (1) can be substituted with any functional groups, including alky, aryl, halogen, amino, etc.

Another aspect of the present invention provides a light-emitting composition, which comprises an organometallic complex having a structure satisfying Chemical Formula (1).

Another aspect of the present invention provides an electron-transporting composition, which comprises an organometallic complex having a structure satisfying Chemical Formula (1).

Another aspect of the present invention provides an organic EL device, which comprises a a first electrode, a second electrode opposing the first electrode, and a first layer located between the first electrode and the second electrode. The first layer contains an organometallic complex having a structure satisfying Chemical Formula (1).

Still another aspect of the present invention provides an electronic device, which comprises a organic EL device display, making use of an organometallic complex.

Still another aspect of the present invention provides a method of generating visible light from an electronic device. The method comprises injecting electrons and holes from two opposing electrodes into at least one layer located between the two electrodes by applying electric power to the two electrodes. The at least one layer contains an organometallic complex satisfying Chemical Formula (1).

Still another aspect of the present invention provides a method of manufacturing an organic EL device. The method comprises providing a substrate, forming a first conductive layer, forming at least one layer; and forming a second conductive layer. The at least one layer contains an organometallic complex of Chemical Formula (1).

Still further aspect of the present invention provides an electroluminescent (EL) device. The device comprises a cathode, an anode, and a layer of material therebetween. The layer of material comprises a compound having the formula M(O), wherein "M" is a metal; "n" is a positive integer depending upon the oxidation state of the metal "M"; and "A" is an organic moeity comprising a plurality of bonded ring structures. The layer of material directly contacts the cathode.

DETAILED DESCRIPTION OF EMBODIMENTS OF THE INVENTION

Now the various aspects of the present invention will be discussed in more detail. It is to be understood at the outset of the description, which follows that persons of skill in the appropriate arts may modify the invention here described while still achieving the favorable results of this invention. Accordingly, the following description is to be understood as being a broad, teaching disclosure directed to persons of skill in the appropriate arts, and not as limiting upon the present invention.

Organic EL Devices

The present inventors have developed organic EL devices, which use organometallic complexes. The organometallic complexes may be of the chemical formula $M(O)_n$, where M is a metal, O is an organic moiety comprising one or more bonded ring structures, and n is integer which varies with the oxidation state of the metal. In some advantageous embodiments, the organometallic complex has a band gap corresponding to blue light emission. In the organic EL devices, these organometallic complexes are used as a material for electron-transportation and/or light-emission although not limited thereto. Also, depending upon the matching of the conduction band of a complex material with the work function of a cathode material, an electron-transporting layer made of the complex material works as an electron-injection layer as well. Moreover, these complex materials enable a single layer construction for the electron-injection, electron-transportation, and light-emission with or without doping of additional fluorescent materials, particularly blue emission. In especially advantageous embodiments, the complexes satisfy Chemical Formula (1) set forth below, and it is these specific embodiments that will be discussed in detail herein.

Now some exemplary organic EL device constructions will be discussed with reference to the accompanying drawings. FIGS. 1 to 4 illustrate simplified cross-sectional views of laminated structures of the exemplary organic EL devices in accordance with the present invention. The organic EL devices shown in FIGS. 1 to 4 commonly include a substrate 1, an anode 2 deposited on the substrate, and a cathode 3 separated from the anode 2 by one or more laminated layers. In these drawings, same reference numbers have been used to indicate like components between the embodiments.

Figure 1:
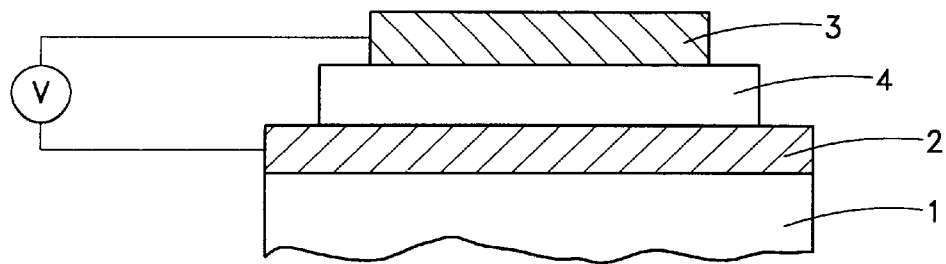
FIG. 1 illustrates a cross-sectional view of an organic EL device in accordance with one exemplary embodiment of the present invention.

FIG. 1 shows an exemplary organic EL device construction having a single light-emitting layer 4 between the anode 2 and the cathode 3. When the device is forward-biased between the anode 2 and the cathode 3, electrons and holes are injected into the light-emitting layer 4 from the cathode 3 and the anode 2, respectively. The light-emitting layer 4 contains an organometallic complex compound as a light-emitting material or light-emitting host material.

As a light emitting material, an organometallic complex generates visible light when electrons and hole recombine in the layer 4. Preferably, the light-emitting layer 4 comprises a significant concentration of an organometallic complex compound of Chemical Formula (1). The complex compounds as a light-emitting material can host another fluorescent or light-emitting material as a dopant to improve the light-emission efficiency and/or to tune the color of light emission. Even if an organometallic complex does not have a fluorescent property, the organometallic complex may primarily form the light-emitting layer by hosting a light-emitting dopant. Advantageously, the dopant is distributed preferably near the anode 2. The mobility of electrons in the light-emitting layer 4 is advantageously higher than that of the holes. Thus, the recombination of the holes and electrons takes place at locations closer to the anode 2 than the cathode 3, where the dopants are preferably present.

Figure 2:
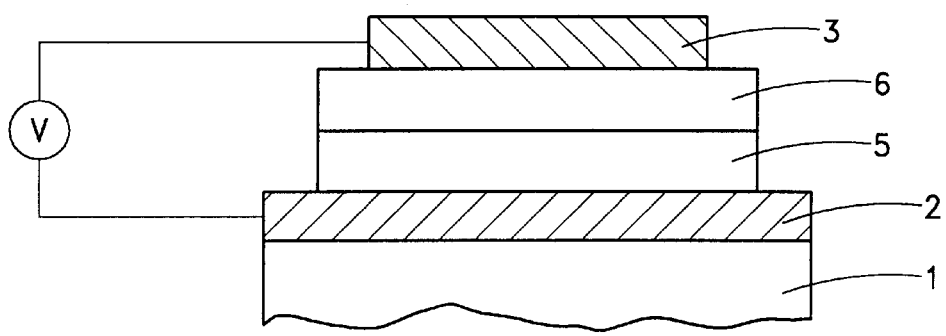
FIG. 2 illustrates a cross-sectional view of an organic EL device in accordance with another embodiment of the present invention.

Referring to FIG. 2, a hole-transporting layer 5 is provided on the anode 2, and an electron-transporting layer 6 is located between the hole-transporting layer 5 and the cathode 3. The electron-transporting layer 6 advantageously contains an organometallic complex material. Preferably, the electron-transporting layer 6 of the organic EL device is primarily made of an organometallic complex compound satisfying Chemical Formula (1) as an electron-transporting material. In this construction, light-emission can occur in either or both of the hole-transporting layer 5 and the electron-transporting layer 6 depending upon doping of light-emitting materials.

If the organometallic complex material used in the electron-transporting layer 6 has fluorescent characteristics, the electron-transporting layer 6 can emit visible light even without doping of another light-emitting material. In order to improve the light-emitting efficiency, however, it is preferable to dope another light-emitting material having higher fluorescent efficient in the electron-transporting layer 6. In the alternative or in combination with the light-emission from the electron-transporting layer 6, the hole-transporting layer 5 can be made of or doped with a fluorescent material. In this case, visible light can be emitted from the hole-transporting layer 5 when electrons and holes recombine therein. When doping a fluorescent material in either or both of the hole-transporting layer 5 and electron-transporting layer 6, preferably, the fluorescent material is doped near the boundary between the two layers 5 and 6.

Figure 3:
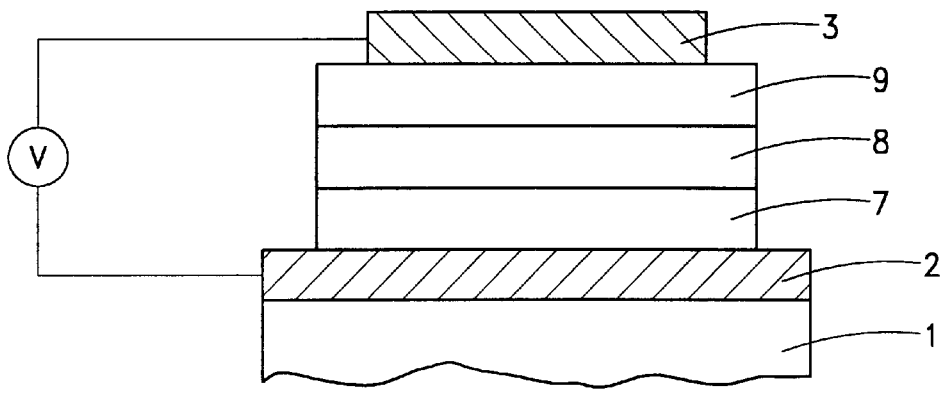
FIG. 3 illustrates a cross-sectional view of an organic EL device in accordance with another embodiment of the present invention.

FIG. 3 shows another exemplary organic EL device construction, in which a separate light-emitting layer 8 is sandwiched between a hole-transporting layer 7 and an electron-transporting layer 9. In this construction, an organometallic complex compound satisfying Chemical Formula (1) is preferably used in either or both of the light-emitting layer 8 and the electron-transporting layer 9.

When the light-emitting layer 8 contains an organometallic complex compound satisfying Chemical Formula (1), the electron-transporting layer 9 can be made of the same or another organometallic complex satisfying Chemical Formula (1), or any other appropriate electron-transporting materials. In the alternative, an organometallic complex compound satisfying Chemical Formula (1) is used in the electron-transporting layer 9, the light-emitting layer 8 may contain the same or another organometallic complex compound satisfying Chemical Formula (1), or any other appropriate light-emitting materials. In either of the cases, the light-emitting layer 9 may be doped with another fluorescent material.

In the exemplary organic EL device constructions of the present invention shown in FIGS. 1–3, the substrate 1 is advantageously made of a transparent material to allow the visible light emitted by the device to pass through. Materials, which can be used for the substrate 1, for example, include glass, quartz and any other appropriate artificial materials such as plastics. Preferably, glass is used for the substrate 1.

The anode 2 is a conductive electrode electrically connected to an electric power source. The anode 2 requires a relatively large work function, advantageously greater than 4 eV. For example, conductive materials which can be used for the anode 2 include: carbon; aluminum, vanadium, chromium, copper, zinc, silver, gold, similar metals, and alloys of the foregoing metals; zinc oxide, indium oxide, indium tin oxide (hereinafter referred to as "ITO"), indium zinc oxide and similar tin oxide or tin oxide indium-based complex compounds; mixtures of oxides and metals, such as ZnO:Al, $SnO_2$:Sb; and conductive polymers, such as poly (3-methylthiophene), poly[3,4-(ethylene-1,2-dioxy) thiophene], polypyrrole, and polyaniline. Advantageously, the anode 2 is also made of a transparent material for the same reason as provided for the substrate 1. Preferably, the anode 2 is made of ITO. Although not illustrated, the anode 2 may be constructed in multiple layers of materials. The thickness of the anode 2 may vary depending on the materials used and its layered structures. However, the anode 2 is laminated advantageously in the range of about 10 nm to about 1000 nm, preferably from about 10 nm to about 500 nm.

The cathode 3 requires a relatively small work function, advantageously smaller than 4 eV. For example, conductive materials which can be used for the cathode 3 include: magnesium, calcium sodium, potassium, titanium, indium, yttrium, lithium, gadolinium, aluminum, silver, tin, lead, and similar metals and alloys thereof Preferably, the cathode 3 is made of aluminum-lithium alloy. The cathode 3 may also be made of a transparent material for the same reason as provided for the substrate 1. Although not illustrated, the cathode 3 may be constructed in multiple layers of materials. For example, the cathode 3 is bilayered, such as LiF/Al and $Li_2O$/Al. The thickness of the anode 3 may vary depending on the materials used and its layered structures. However, the cathode 3 is laminated advantageously in the range of about 1 nm to about 10,000 nm, preferably from about 10 nm to about 5,000 nm.

The electron-transporting layer 6, 9 contains an electron-transfer material to transfer the electron injected from the cathode 3 to a light-emitting layer 4, 8 or to an area where light-emitting materials are doped. Compounds having a high electron mobility is used as an electron-transporting material, The electron-transporting layer 6, 9 also has the function of blocking holes from the anode 2 or the neighboring layer 5 move toward the cathode 3. The electron-transporting layer 6, 9 is to enable a large number of electron to be injected from the cathode 3 at a low electric field applied to the device. Although not illustrated in the exemplary constructions of FIGS. 1–3, another layer for electron-injection may be used in addition to the electron-transportine layer 6, 9. In such a construction, the electron-injection layer is advantageously located between the cathode 3 and the electron-transporting layer 6, 9. The LUMO level of the electron-injecting layer is located between the work function of the cathode 3 and that of the electron-transporting layer 6, 9.

As discussed above, the electron-transporting layers 6, 9 are preferably made of an organometallic complex compound of Chemical Formula (1). The electron-transporting layers 6, 9 may further contain other electron-transporting materials along with the organometallic complex compounds satisfying Chemical Formula (1). For example, aluminum complexes of 8-hydroxyquinoline can be added.

The hole-transporting layer 5, 7 containing a hole-transfer material has the function to smoothly transfer the holes injected from the anode 2 to a light-emitting layer 4, 8 or to an area where tight-emitting materials are doped. Materials having a high hole mobility therein is advantageous. This layer 5, 7 also has the function of blocking electrons from the cathode 3 or the neighboring layer 6 to move toward the anode 2. Another important function of the hole-transporting layer 5, 7 is to enable a large number of holes to be injected from the anode 2 at a low electric field applied to the device. Although not illustrated, another layer for hole-injection may be used in addition to the hole-transporting layer 5, 7. In this construction, the hole-injection layer is advantageously located between the anode 2 and the hole-transporting layer 5, 7. The HOMO level of the hole-injecting layer is located between that of the hole-transporting layer 5, 7 and the work function of the anode 2.

For example, hole-injecting materials include metal porphyrine and derivatives of quinacridone. Examples of hole-transporting materials are oxadiazole derivatives, triazole derivatives, phenylene derivatives, arylamine derivatives, conjugated polymers, block co-polymers with conjugated and non-conjugated repeating units, and the like. Normally, hole-transporting materials function for both the hole-injection and hole-transportation without a separate hole-injecting layer. The hole transporting layer 5, 7 may contain one or more of these hole injecting/transporting materials. Advantageously, a derivative of the arylamine, 4,4'-bis[N-(1-naphthyl)-N-phenylamino]biphenyl(NPB) is used as the material for the hole transporting layers 5, 7.

The light-emitting layers 4, 8 can further include other appropriate fluorescent material along with an organometallic complex material of Chemical Formula (1). Such fluorescent materials include, for example, 8-hydroxyquinoline metal complex, dimerized styryl compound (U.S Pat. No. 5,366,811), BAlq (U.S. Pat. No. 5,150,006), 10-hydroxybenzo [h] quinoline metal complex (U.S. Pat. No. 5,529,853), 2(2'-hydroxy-5'methylphenyl) benzotriazole metal complex (U.S. Pat. No. 5,486,406), benzoxazole, benzthiazole, benzimidazole and derivatives thereof (U.S. Pat. No. 5,645,948), poly(p-phenylene vinylene) and derivatives thereof (Synthetic Metals 91, 35, 1997 and Synthetic Metals 91, 109, 1997), spiro compound (U.S. Pat. No. 5,840,217), polyfluorene, rubrene or the like. These materials can also be mixed with the organometallic complex compounds satisfying Chemical Formula (1) with or without dopants. Although not illustrated, the light-emitting layer 4, 8 may include multi-sublayers of different light-emitting materials emitting different colors in order to tune the color of the emission light. Alternatively or in combination with the multi-sublayer configuration, these light-emitting layer 4, 8 may include a layer containing a mixture of more than one light-emitting material.

Fluorescent dopants are provided in one or more of the layers of an organic EL device to improve the light-emission efficiency, to tune the color of the emission, and/or to simply emit light from a layer having a non-fluorescent host. A dopant is selected from fluorescent materials having a higher quantum efficiency than the host material. Preferably, the dopants have a quantum yield close to "1" in a dilute system. For example, fluorescent materials, which can be used as a dopant in an organic EL device, include: perylene, rubrene, coumarine, quinacridone, nile red, DCM, etc.

When light-emitting materials are doped into any of the light-emitting, hole-transporting and electron-transporting layers 4, 5, 6, 8, it is preferable that light-emitting materials having a band gap close to that of the host materials are selected. More preferably, light-emitting materials to be doped into the host materials have a slightly smaller band gap than that of the host materials. More than one light-emitting materials can be doped together in a light-emitting layer 4, 8, hole-transporting layer 5 or electron-transporting layer 6. Like the multi-sublayered light-emitting layer as discussed above, a plurality of different dopants can be doped in multi-layered configuration in the host layer.

In either configuration whether or not a separate light-emitting layer is provided, quantum efficiency and lifetime of the organic EL device can be enhanced depending on the selection of light-emitting materials and their concentrations. Also, the thickness of the sublayers and the concentrations of the light-emitting materials can be adjusted to obtain a narrow emission spectrum meaning to fine tune the color.

New Organometallic Complex Compounds

New organometallic complex compounds have been synthesized and researched by the present inventors. These organometallic complex materials have various properties for use in organic EL devices.

The new organometallic complex compounds are represented by the following Chemical Formula (1):

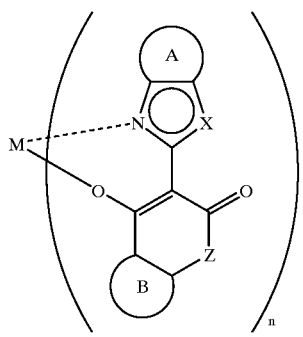

Chemical Formula (1)

In the Chemical Formula (1), "X" is one selected from the group consisting of carbon, oxygen, sulfur, selenium, and nitrogen with or without an additional functional group bonded thereto. "Z" is one selected from the group consisting of carbon, oxygen, sulfur, selenium, and nitrogen with or without an additional functional group bonded thereto. All the implicit hydrogens of Chemical Formula (1) can be substituted with any functional groups.

"M" is a metal and preferably is a monovalent, divalent or trivalent metal. More preferably, "M" is one selected from lithium, beryllium, zinc, magnesium, gallium, indium and aluminum. Most preferably, "M" is lithium, or zinc. "n" is a positive integer depending upon the oxidation state of the metal "M".

"A" is an aromatic or heterocyclic ring, in which implicit hydrogens of the ring structures can be substituted with any functional groups, preferably alkyl, aromatic, halogen, amine group, etc. Preferably, ring "A" is one selected from the group consisting of the rings as shown below, which are shown together with the pentagonal ring having N and "X".

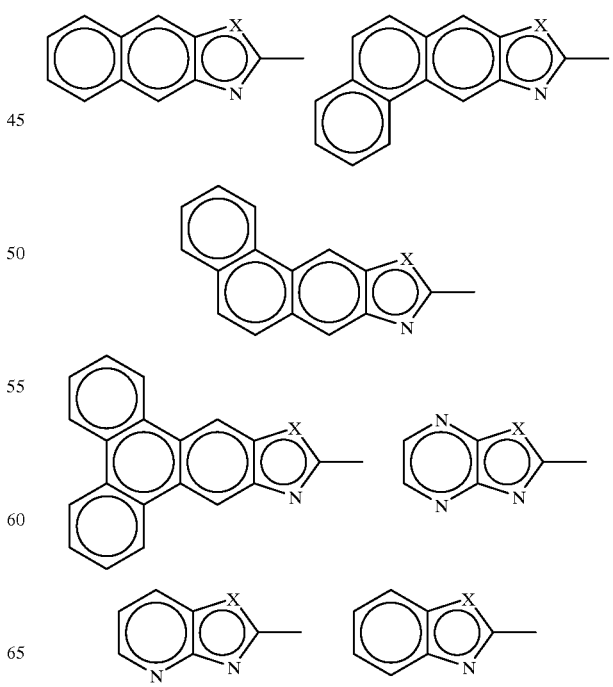

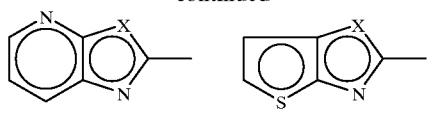

"B" is an aromatic or heterocyclic ring, in which implicit hydrogens of the ring structure can be substituted with any functional groups, preferably alkyl, aromatic, halogen, amine group, etc. Preferably, ring "B" is one selected from the group consisting of the rings as shown below, which are shown together with the hexagonal ring with "Z".

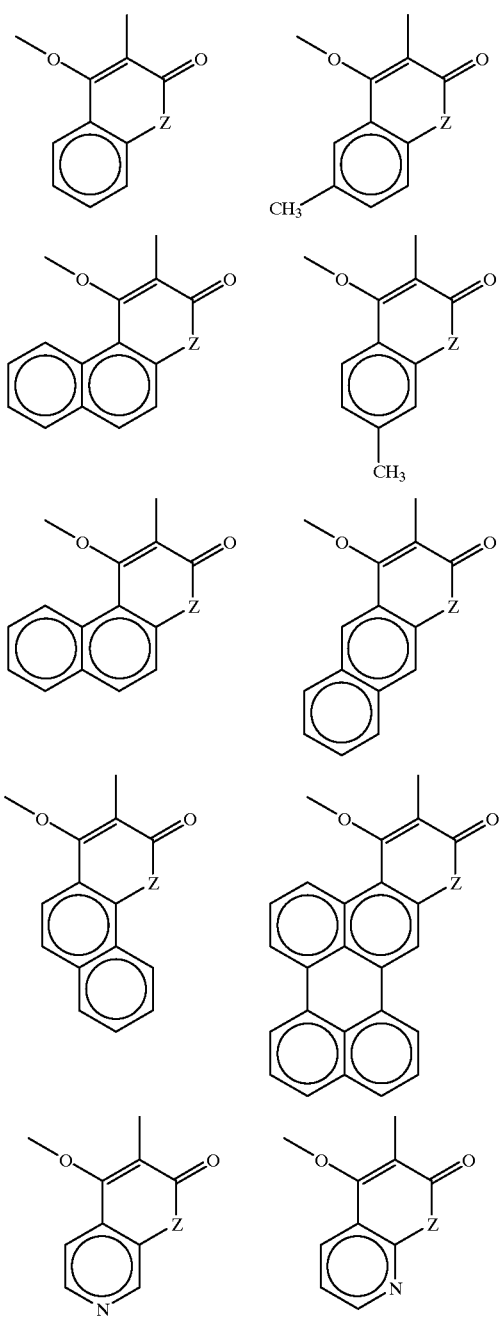

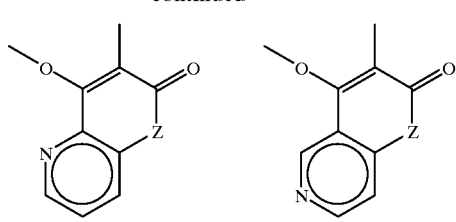

Following Chemical Formulas (2) to (12) are organometallic complexes satisfying the general structure of Chemical Formula (1). These organometallic complex compounds are listed to provide examples of Chemical Formula (1) only and do not limit the scope of the organometallic complex according to the present invention.

Chemical Formula (2)

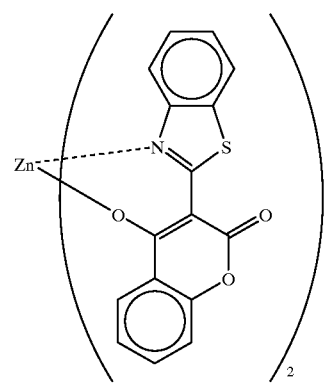

Chemical Formula (3)

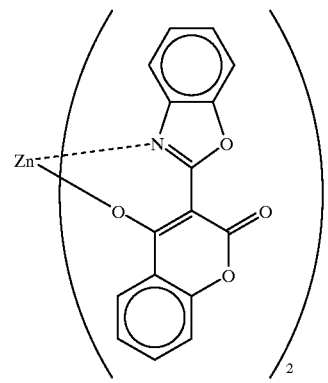

Chemical Formula (4)

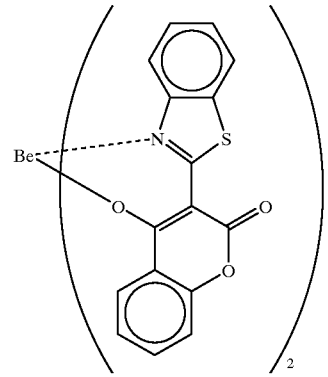

Chemical Formula (5)
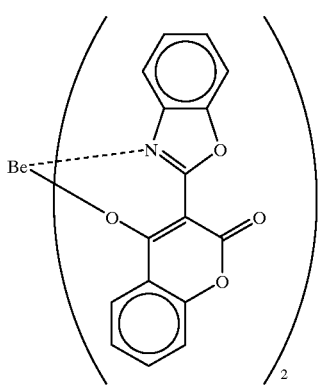
Chemical Formula (6)
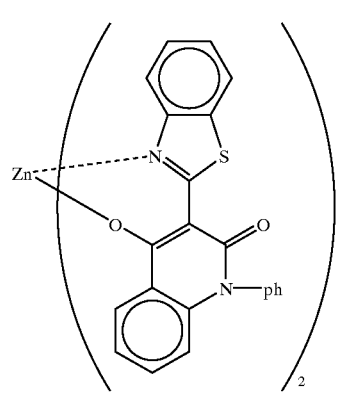
Chemical Formula (7)
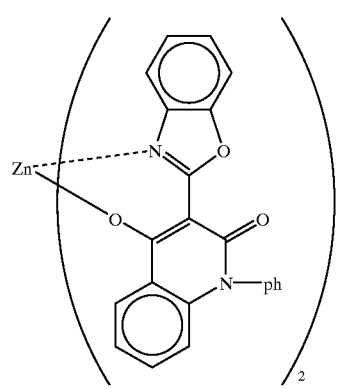
Chemical Formula (8)
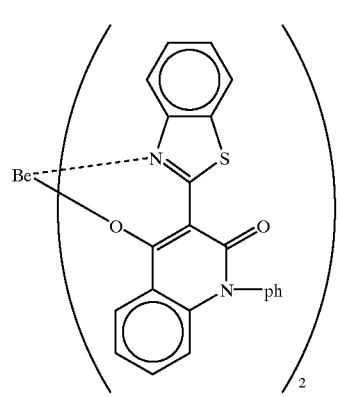
Chemical Formula (9)
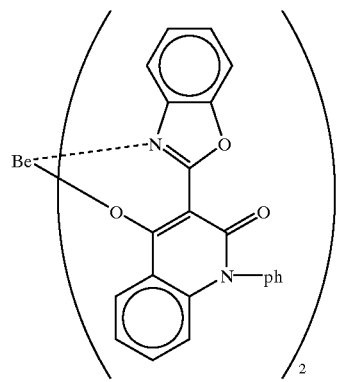
Chemical Formula (10)
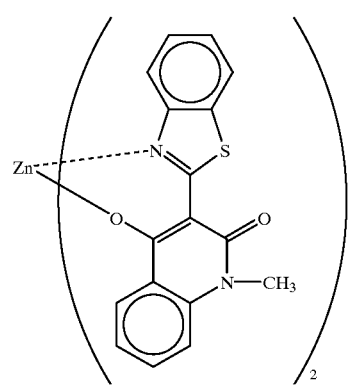
Chemical Formula (11)
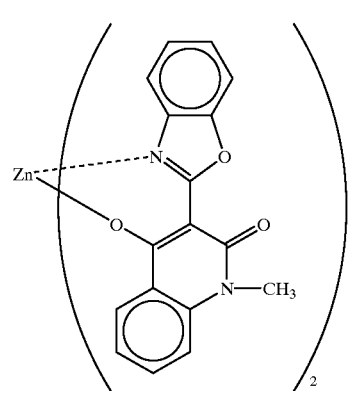
Chemical Formula (12)
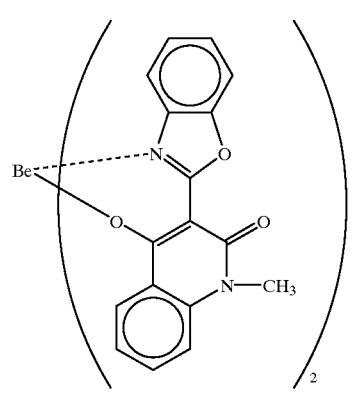

The new organometallic complex compounds satisfying Chemical Formula (1) in accordance with the present invention generally have a light-emitting or fluorescent property, in particular, with a band gap for blue emission. A light-emitting layer of an organic EL device can be made of these organometallic complex compounds. Also, these complex materials can host other fluorescent or light-emitting materials to improve the efficiency and/or to tune various colors of light-emission. The organometallic complex compounds having a band gap corresponding to blue light emission, whether or not being fluorescent, can host other fluorescent materials for blue light emission or emission of light having a longer wavelength.

The new organometallic complex compounds of the present invention generally have good electron-transporting properties. An electron-transporting layer of an organic EL device can be formed of these complex compounds. In combination with the light-emitting property, these complex compounds may form one layer providing both light-emission and electron-transportation functions. Also, the low reduction potential of these materials of the present invention enables avoiding forming a separate electron-injecting layer.

Moreover, these new organometallic complex compounds advantageously block holes transferred from a neighboring layer in an organic EL device. This hole blocking property enables to selectively move the emission zone between the two layers. If the neighboring layer, e.g., a hole-transporting layer, is not doped with a fluorescent material, the light emits at the organometallic complex near the boundary of the two layers. In the alternative, if the hole-transporting layer is doped with a fluorescent material, emission can occur only at the doped neighboring layer since the holes may not easily cross the boundary into the complex material layer.

A band gap, a highest occupied molecular orbital (HOMO) level and a lowest unoccupied molecular orbital (LUMO) level of compounds satisfying Chemical Formula (1) are adjustable with changes of metal "M", ring "A", ring "B", and substituting hydrogen atoms of aromatic groups with alky, aromatic, halogen, amine group, etc.

Furthermore, these compounds have relatively high melting points, which will improve thermal stability of any electronic device using the these materials, particularly, organic EL devices. The characteristics of the organometallic complex compounds will be further discussed in terms of organic EL devices using them.

Various aspects and features of the present invention will be further discussed in terms of the following examples, which are intended to illustrate the present invention but not limit the scope of the present invention.

ORGANOMETALLIC COMPLEX

EXAMPLE 1

Synthesis of Chemical Formula (2)
Preparation of Ligand Precursor Chemical Formula (13)

50 ml of dimethyl sulfoxide (DMSO) was charged into a vessel cleaned with nitrogen. Next, 2.5 g of 4-hydroxycoumarine and 2.1 g of phenylisothiocyannate were added to the DMSO and dissolved, thereby forming a mixture. 1.55 g of triethylamine was added to the mixture and components in the mixture were subjected to reaction while agitating at room temperature for 2 hours. After reaction was completed the reaction solution was added to 100 ml of hydrogen chloride of 3 N concentration to form a yellow solid. Subsequently, the yellow solid was dried, and by recrystallizing the yellow solid in 200 ml of acetone, 2.4 g of a compound of Chemical Formula (13) below was obtained at the yield of 52 percent.

Chemical Formula (13)

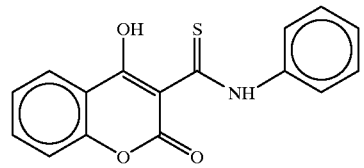

Preparation of Ligand Chemical Formula (14)

0.2 g of the compound represented by Chemical Formula (13) above was dissolved in 10 ml of chloroform, then 0.034 ml of bromine was slowly added to the chloroform solution and left to react at room temperature for 5 hours. A precipitate formed by the reaction was then filtered, washed with ethanol, and dried in vacuum to obtain 0.18 g of a ligand compound of Chemical Formula (14) below.

Chemical Formula (14)

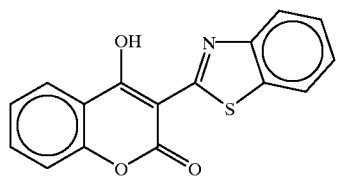

The melting point of the compound represented by Chemical Formula (14) was found to be 283° C., and NMR results were as follows: $^1$H-NMR (DMSO-d6): 7.39 (m, 2H), 7.48 (t, 1H), 7.60 (t, 1H), 7.72 (t, 1H), 8.06(d, 1H), 8.14 (d, 1H), 8.21 (d, 1H)

Synthesis of Chemical Formula (2)

0.75 g of the ligand compound of Chemical Formula (14) was dissolved in 120 ml of dimethyl formaldehyde (DMF), and 0.27 g of $Zn(OAc)_2 \cdot 2H_2O$ was added to the DMF solution and left to react at room temperature for 5 hours. A precipitate formed by the reaction was then filtered, washed with ethanol, and dried in vacuum to obtain 0.7 g of a white solid compound of Chemical Formula (2) below at the yield of 84 percent.

Chemical Formula (2)

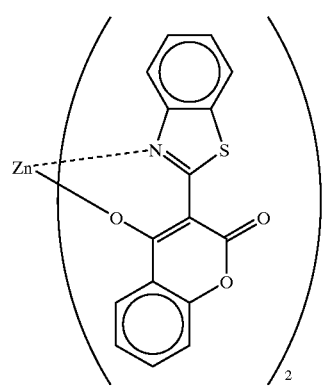

To manufacture a device, the compound represented by Chemical Formula (2) should be further purified with a train sublimation apparatus before being used. The melting point of the compound of Chemical Formula (2) was found to be 420° C., and atomic analysis results were as follows:

Theoretical value: C(58.8), H(2.4), N(4.2), Zn(9.9)
Experimental value: C(58.8), H(2.3), N(4.1), Zn(9.6)

EXAMPLE 2

Synthesis of Chemical Formula (10)
Preparation of Ligand Precursor Chemical Formula (15)

After 5 g (28.54 mmol) of 4-hydroxy-N-methylquinoline was dissolved in 85 ml of DMSO to form a mixture and, 4 ml of triethylamine was added to the mixture and agitated for 10 minutes. Next, 3.46 ml of phenylisocyannate was added to the DMSO solution and left to react while agitating at room temperature for 1 hour. After reaction was completed, the reaction solution was added to a hydrogen chloride water solution of 3 N concentration. Subsequently, a precipitate, formed by the reaction and the addition to the hydrogen chloride water solution, was agitated, filtered, washed with water and dried in vacuum. The dried precipitate was recrystallized in acetone to obtain 1.8 g of a compound of Chemical Formula (15) below at the yield of 20 percent.

Chemical Formula (15)

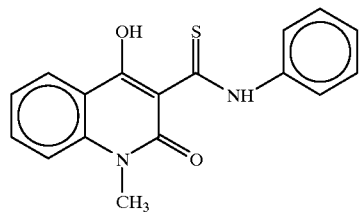

Preparation of Ligand Chemical Formula (16)

1.69 g (5.44 mmol) of the compound represented by Chemical Formula (15) was dissolved in 65 ml of chloroform, and 0.28 ml of bromine was slowly added to the chloroform solution and left to react at room temperature for 5 hours. The solid precipitate was then agitated at room temperature for 3 hours, filtered, and washed with chloroform. The chloroform solution was again washed in 70 ml of ethanol while agitating, filtered, and dried in vacuum to obtain 1.5 g of 4-hydroxy-1-methyl-3-benzthiazoyl-2(1H)-quinolone of Chemical Formula (16) below at the yield of 90 percent.

Chemical Formula (16)

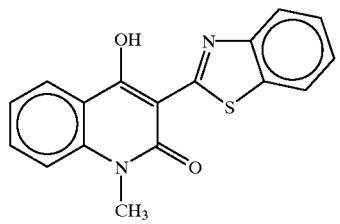

NMR analysis results of the compound represented by Chemical Formula (16) were as follows: $^1$H-NMR(DMSO-d6): 3.6 (s, 3H), 7.3M7.7 (m, 5H), 8M8.2 (m, 3H)

Synthesis of Chemical Formula (10)

1.2 g (3.89 mmol) of the compound represented by Chemical Formula (16) was dissolved in 300 ml of DMF and 0.43 g (1.95 mmol) of zinc acetate was added to the DMF solution. The mixture was agitated at a temperature of 50 to 60° C. for 5.5 hours, filtered, washed with ethanol, and dried in vacuum to obtain 0.95 g of a white solid compound of Chemical Formula (10) at the yield of 72 percent.

Chemical Formula (10)

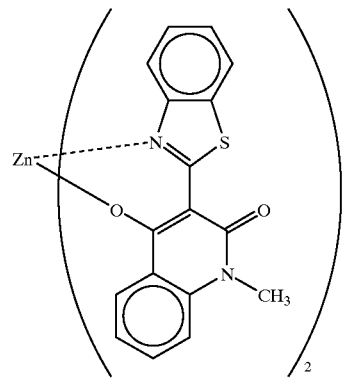

The compound of Chemical Formula (10) should be further purified with a train sublimation apparatus before being used in the manufacture of a device. The melting point of the compound represented by Chemical Formula(10) was found to be 451° C., and atomic analysis results of the compound were as follows:

Theoretical value: C(60.14), H(3.13), N(8.11), Zn(9.20)
Experimental value: C(60.05), H(3.26), N(8.24), Zn(9.61)

EXAMPLE 3

Synthesis of Chemical Formula (6)
Preparation of Precursor Chemical Formula (17)

50 g of diphenylether was added to a mixture of 16.9 g of diphenylamine and 32 g of diethylmalonate. Next, the resulting mixture solution was refluxed at 250° C. for 5 hours, cooled to 100° C., and 50 ml of 1,4-dioxane was added to the mixture solution to obtain a precipitate. After 12 hours the precipitate was filtered, washed with 1,4-dioxane diethylether, and dried in vacuum to obtain 25.4 g of a compound of Chemical Formula (17) at the yield of 83 percent.

Chemical Formula (17)

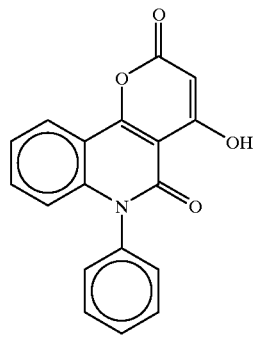

Preparation of Precursor Chemical Formula (18)

24.4 g of the compound represented by Chemical Formula (18) was added to a mixture solution comprising 250 ml of glycol, and 25 ml of water and 16 g of sodium hydroxide. The mixture solution was then left to react while agitating at a temperature of 100° C. for 1 hour. After cooling the reacted mixture, the reacted mixture was added to 200 ml of iced water, then 40 ml of concentrated hydrogen cloride was slowly added to the iced water solution to acidify the solution, thereby obtaining a precipitate. The obtained precipitate was filtered, washed with water, and dried in vacuum to obtain 20.4 g of a compound of Chemical Formula (18) below at the yield of 91 percent.

Chemical Formula (18)

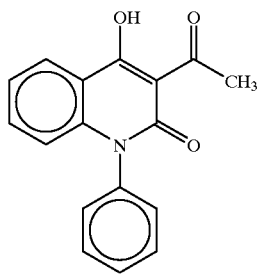

Preparation of Precursor Chemical Formula (19)

16.9 g of the compound represented by Chemical Formula (18) was dissolved in 40 ml of concentrated hydrogen sulfuric acid. The resulting mixture was then heated to a temperature of 140° C. and left to react at this temperature for 150 minutes. After reaction was completed the reaction solution was added to ice water, left at room temperature for 12 hours, filtered, washed with water, and dried in vacuum to obtain 15.8 g of a compound of Chemical Formula (19) below at the yield of 95 percent.

Chemical Formula (19)

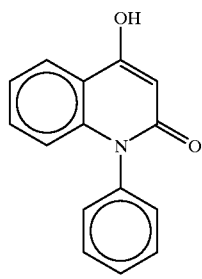

Preparation of Precursor Chemical Formula (20)

6.85 g of the compound of Chemical Formula (19) was dissolved in 50 ml of DMSO, and 4 g of phenylisocyannate and 2.7 ml of triethylamine were added to the DMSO solution. The solution was then left to react while agitating at room temperature for 5 hours. When the reaction was complete, the reaction solution was poured into 150 ml of hydrogen chloride of 3 N concentration to obtain a precipitate. The obtained precipitate was filtered, washed with water, and dried in vacuum. Next, the dried precipitate was dissolved in 100 ml of ethanol, and undissolved compounds were filtered and removed, after which the ethanol was distilled out of the solution. Most of the remaining solid was a compound of Chemical Formula (20) below.

Chemical Formula (20)

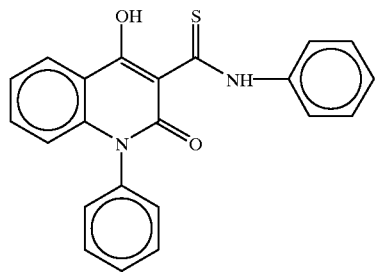

Preparation of Ligand Chemical Formula (21)

4.43 g of the compound of Chemical Formula (20) was dissolved in 20 ml of chloroform, and 1.9 ml of bromine was slowly added to the chloroform solution and left to react at room temperature for 5 hours. A precipitate produced form the reaction was then filtered, washed with ethanol, and dried in vacuum to obtain 4.1 g of a white solid of Chemical Formula (21) below.

Chemical Formula (21)

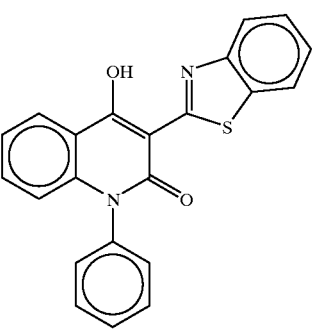

The melting point of the compound represented by Chemical Formula (21) was found to be 290° C., and NMR results of this compound were as follows: $^1$H-NMR (DMSO-d6): 6.52 (d, 1H), 7.26 (t, 1H), 7.66 M7.23 (m, 8H), 8.10M8.26 (m, 3H)

Synthesis of Chemical Formula (6)

1.3 g of the compound of Chemical Formula (21) was added to 40 ml of dimethylformamide, and the solution was beated to a temperature of 100° C. to dissolve the compound 0.38 g of $Zn(OAc)_2.2H_2O$ was added to the dimethylformamide solution, and the solution was agitated at the same temperature for 2 hours then cooled to room temperature. After cooling the solution 8 ml of water was added to the solution to saturate the solution, thereby obtaining a precipitate. Next, the obtained precipitate was filtered, washed with ethanol, and dried in vacuum to obtain 1.2 g of a compound of Chemical Formula (6).

Chemical Formula (6)

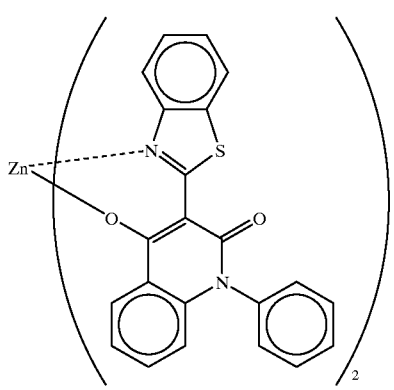

To manufacture a device, the compound represented by Chemical Formula (6) should be further purified with a train sublimation apparatus before being used. The melting point of the compound represented by Chemical Formula (6) was found to be 400° C., and atomic analysis results of the compound were as follows:

Theoretical value: C(65.71), H(3.25), N(6.96), Zn(8.13)
Experimental value: C(65.30), H(2.94), N(6.48), Zn(8.10)

ORGANIC EL DEVICE

EXAMPLE 4

UV-Visible Spectrum

To confirm that the compounds represented by Chemical Formula (1) transfer energy to a blue fluorescent material, a UV-visible spectrum was obtained according to the following procedures.

A glass plate was ultrasonically cleaned in an organic solvent and dried. The dried glass plate was transferred into a thermal vacuum deposition chamber. The compound represented by Chemical Formula (2) prepared Example 1 was deposited by thermal vacuum evaporation on the glass plate at a thickness of 50 nm, at a coating speed of 0.3 nm/second, and in a vacuum of 7 to 10 torr.

Figure 4:
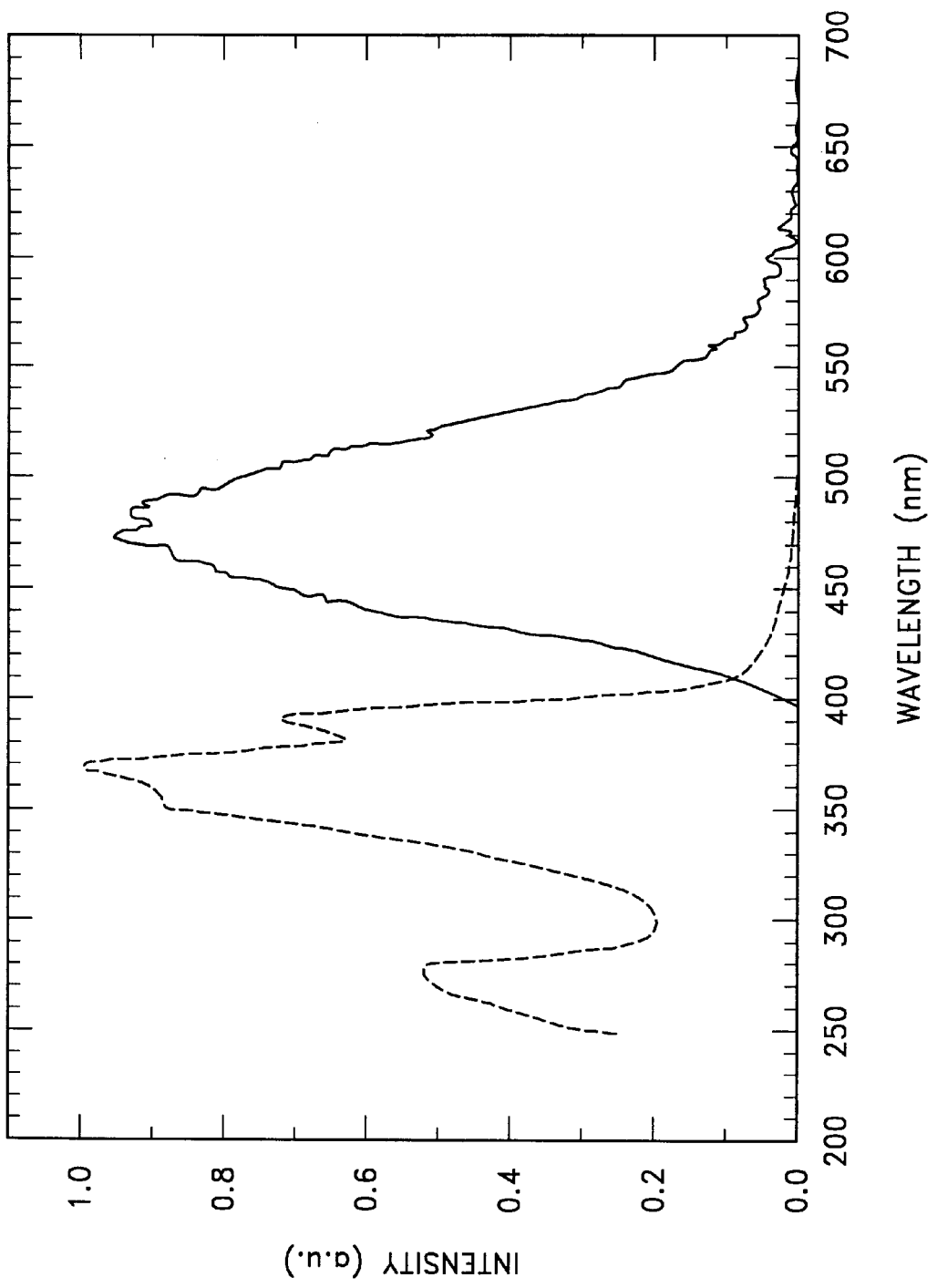
FIG. 4 is a UV-visible absorption spectrum and a light emitting spectrum discussed in Example 4.

The obtained absorption and light emitting spectra of the compound are shown in FIG. 4. The dotted line represents the absorption spectrum, and the solid line represents the light emitting spectrum. An absorption edge of 405 nm indicates that the compound of Chemical Formula (2) can transfer energy to a blue fluorescent material having a similar band gap as, or to a green, yellow or red fluorescent material having a lower band gap than that of the compound.

EXAMPLE 5

Construction of Organic EL Device and a Light Emitting Test

An organic EL device of the type shown in FIG. 3 was manufactured, using the compound of Chemical Formula (2) as an electron-transporting material and Alq3 as a light-emitting material. Light emission and current density was measured while varying the voltage applied to the device.

A glass substrate coated with a thin film of indium tin oxide (ITO) obtained from LG Phillips LCD was ultrasonically cleaned in an organic solvent and dried. The surface was further treated with oxygen plasma. The glass substrate prepared was transferred into a deposition chamber without breaking vacuum of $10^{-7}$ torr and fixed by a substrate holder. About 60 nm of 4,4'-bis[N-(1-naphthyl)-N-phenylamino] biphenyl (NPB) was deposited as a hole-transporting layer over the ITO film at a rate of 0.3 nm/second by thermal vacuum evaporation. About 30 nm of Alq3 (light-emitting layer) was deposited on the NPB layer at a rate of 0.3 nm/second by thermal vacuum evaporation. Subsequently, about 20 nm of the compound of Chemical Formula (2) was deposited at a rate of 0.3 nm/second by thermal vacuum evaporation. Then, a cathode layer was formed by depositing about 0.5 nm of LiF on the electron transporting layer at a rate of 0.02 nm/second and depositing about 200 nm Al over the LiF layer at a rate of 0.5 nm/second by thermal vacuum evaporation, thereby completing an organic EL device.

Figure 5:
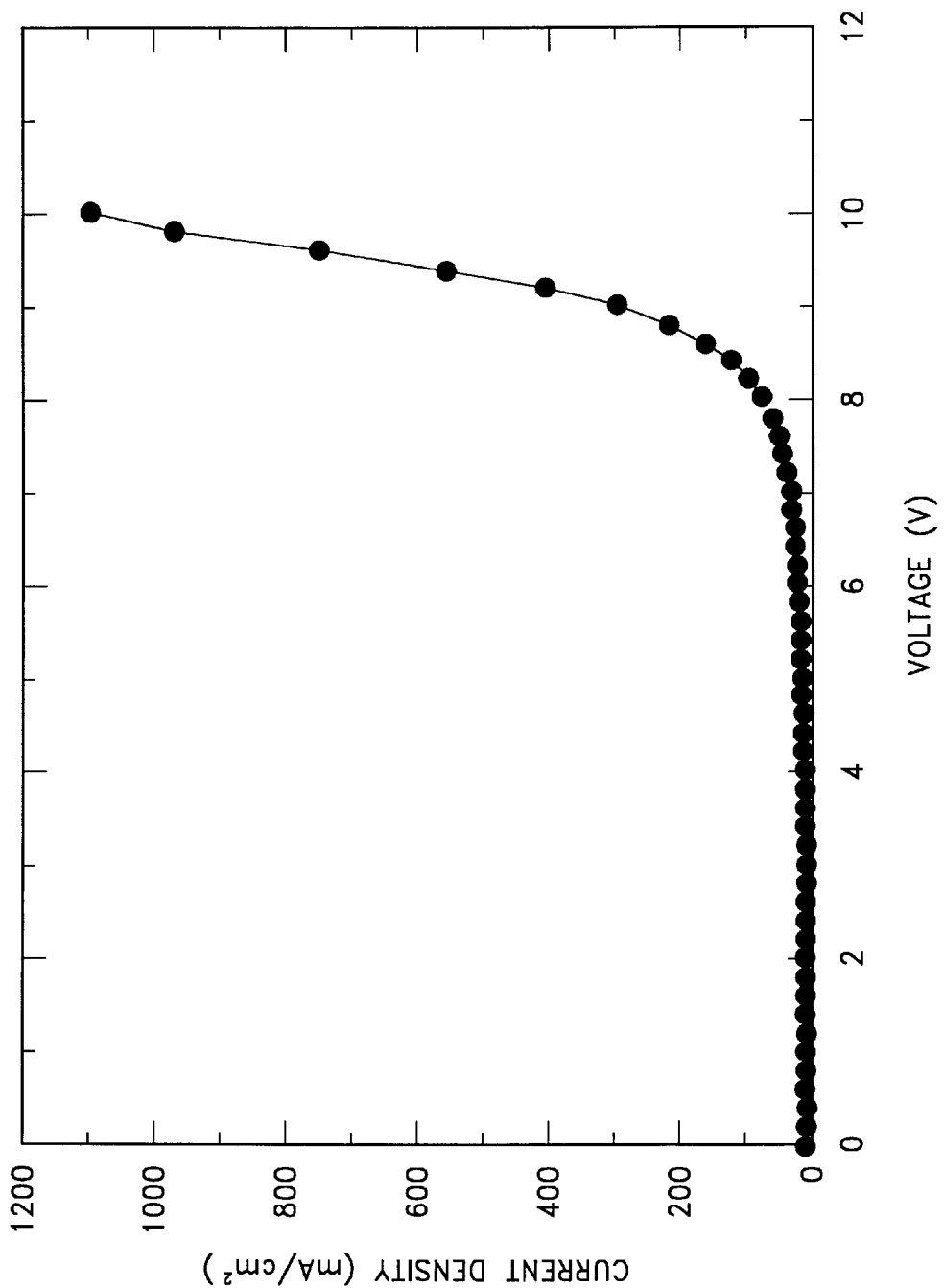
FIG. 5 illustrate currant and driving voltage of the organic EL device of Example 5.

Voltage-current relationship was measure while applying a forward bias to the constructed device, as shown in FIG. 5. Green light emission from the Alq3 was observed from at about 2.3 V. At 5.5V, the current density was 10 mA/cm$^2$ and the brightness was 400 cd/m$^2$. When the current density was increased to 200 mA/cm$^2$, the brightness reached 8296 cd/m$^2$.

EXAMPLE 6

Construction of Organic EL Device and a Light Emitting Test

An organic EL device of the type shown in FIG. 2 was manufactured, using the compound of Chemical Formula (2) as electron-transporting material and perylene as a light-emitting material doped in the hole-transporting layer. Light emission and current density was measured by varying the voltage applied to the device.

A glass substrate coated with a thin film of indium tin oxide (ITO) was ultrasonically cleaned in an organic solvent and dried. The surface was further treated with oxygen plasma. The glass substrate prepared was transferred into a thermal vacuum deposition chamber without breaking vacuum of $10^{-7}$ torr and fixed by a substrate holder. About 60 nm of a 4,4'-bis[N-(1-naphthyl)-N-phenylamino] biphenyl (NPB) as hole-transporting material doped with a fluorescent compound of perylene was deposited over the ITO film at a rate of 0.7 nm/second and 0.03 nm/second, respectively, by thermal vacuum evaporation. Subsequently, about 50 nm of the compound of Chemical Formula (2) was deposited at a rate of 0.3 nm/second by thermal vacuum evaporation. A cathode layer 3 was then formed by depositing about 0.5 nm of LiF layer on the electron-transporting layer at a rate of 0.02 nm/second and depositing about 200 nm of Al layer on the LiF layer at a rate of 0.5 nm/second by thermal vacuum evaporation.

Figure 6:
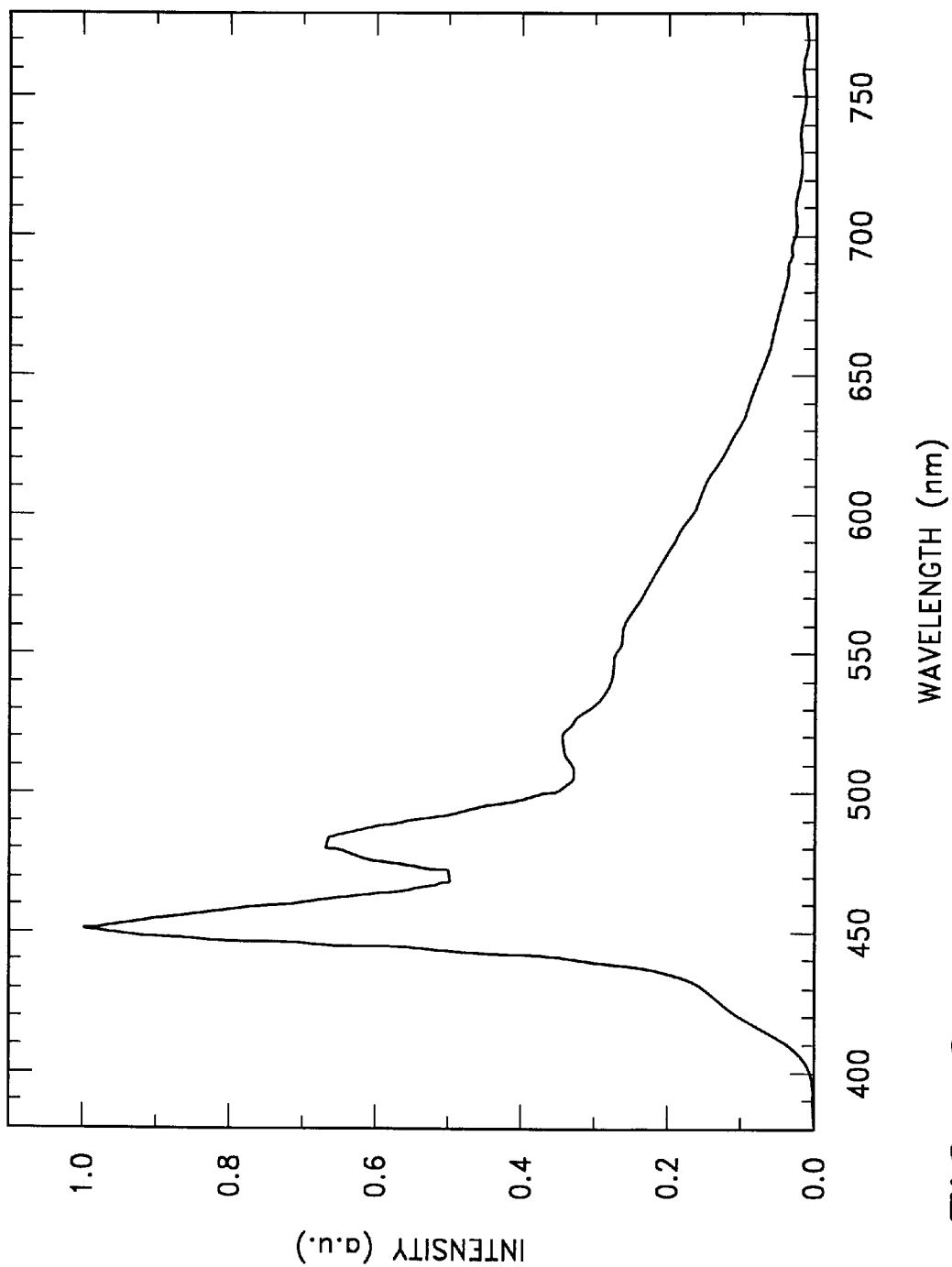
FIG. 6 is a light emitting spectrum of the organic EL device of Example 6.

When a forward bias was applied to the constructed device, a light-emitting spectrum generated by perylene doped into NPB was obtained as shown in FIG. 6.

EXAMPLE 7

Construction of Organic EL Device and a Light Emitting Test

An organic EL device of the type shown in FIG. 3 was manufactured, using the compound of Chemical Formula (6) as a light-emitting host material. Light emission and current density was measured by varying the voltage applied to the device.

A glass substrate coated with a thin film of indium tin oxide (ITO) was ultrasonically cleaned in an organic solvent and dried. The surface was further treated with oxygen plasma. The glass substrate prepared was transferred into a thermal vacuum deposition chamber without breaking vacuum of $10^{-7}$ torr and fixed by a substrate holder. About 20 nm of copper phthalcyanine layer was deposited over the ITO film by thermal vacuum evaporation to increase an interfacial strength between the anode and the hole-transporting layer. Subsequently, about 40 nm of hole-transporting material of 4,4'-bis[N-(1-naphthyl)-N-phenylamimo]biphenyl (NPB) was deposited on the copper phthalcyanine layer by thermal vacuum evaporation. Next, about 40 nm of the compound of Chemical Formula (6) synthesized in Example 3 with a blue light-emitting dopant of perylene was formed as light-emitting layer. The compound of Chemical Formula (6) was deposited at a rate of 0.7 nm/second and the perylene was deposited at a rate of 0.03 nm/second, both by thermal vacuum evaporation. About 20 nm of Alq3 as electron transporting layer was deposited at a rate of 0.3 nm/second by thermal vacuum evaporation. Finally, a cathode layer was then formed by depositing about 0.5 nm of LiF on the electron-transporting layer at a rate of 0.02 nm/second and depositing about 200 nm of Al on the LiF layer at a rate of 0.5 nm/second by thermal vacuum evaporation.

Figure 7:
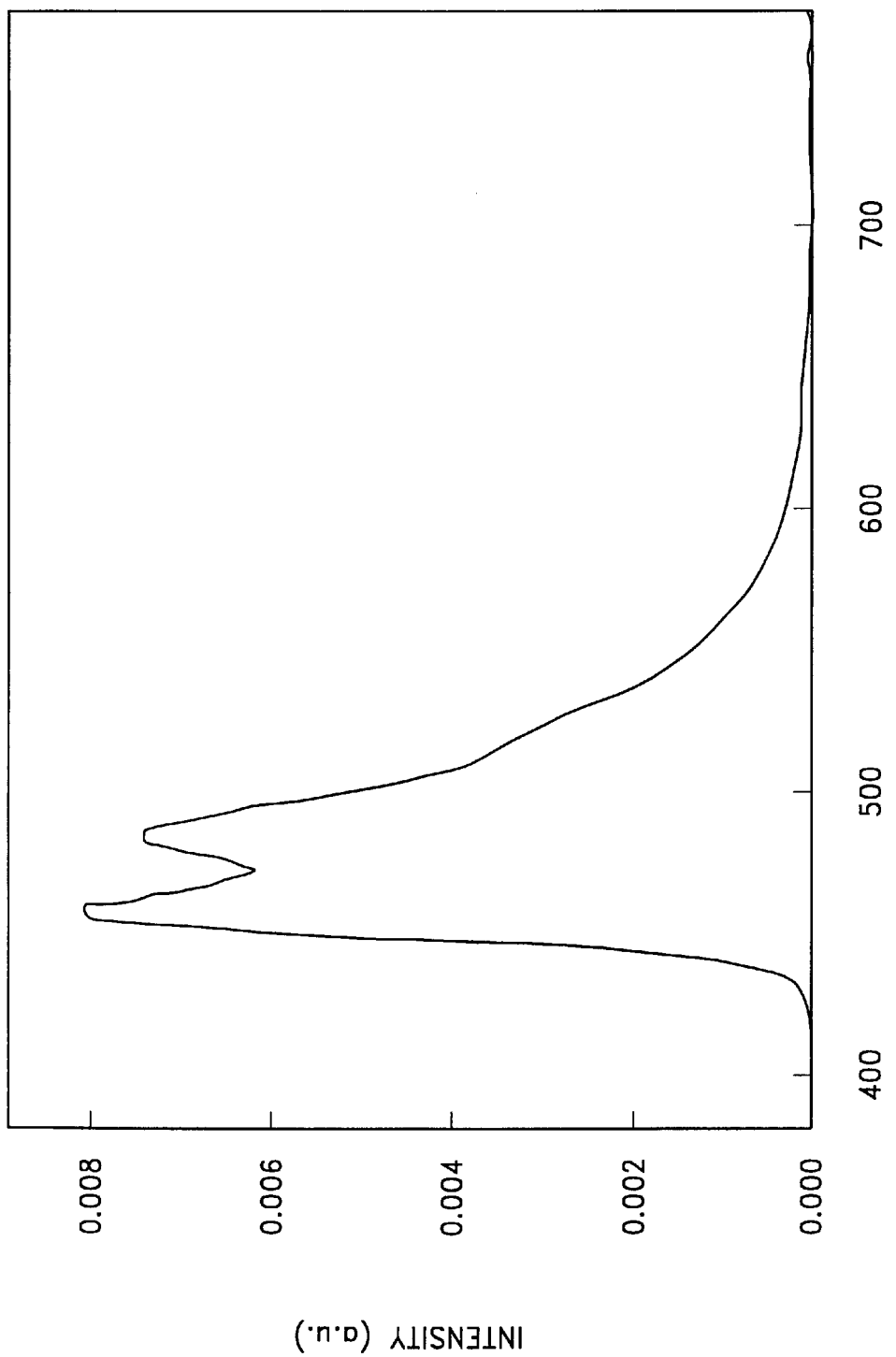
FIG. 7 is a light emitting spectrum of the organic EL device of Example 7.

When a forward bias was applied to the constructed device, blue light emission with brightness of 250 cd/m² from the perylene dopant was observed at 8V. The spectrum illustrating this is shown in FIG. 7.

As disclosed above, the organometallic complexes according to the present invention have various characteristics for use in an organic EL devices: light emission or fluorescence, electron transportation, electron injection, and hole blocking. Also, high melting points of the present organometallic complexes enables to manufacture thermally stable organic EL devices. The organic EL devices according to the present invention can be used in implementing alpha numerical displays, segmented displays, indicating lights, full color displays, and any type of displays or light sources which can incorporate organic EL.

Although the applications of the new organometallic complexes are illustrated in terms of organic EL devices, the organometallic complexes of the present invention are not limited to the use in the organic EL devices. With good electron-transporting, electron-injecting and hole-blocking characteristics and other properties, the organometallic complexes according to the present invention will also have various applications other than EL devices. For example, the organometallic complexes of the present invention can also be used in solar cells, organic thin film transistors, etc.

Although this invention has been described in terms of a certain preferred embodiment, other embodiments apparent to those of ordinary skill in the art are also within the scope of this invention. For instance, as will be readily apparent to those skilled in the art, however, certain aspects of each embodiment can be combined with other embodiments. Accordingly, the scope of the invention is intended to be defined only by the claims that follow.

What is claimed is:

1. An organometallic complex comprising the structure:

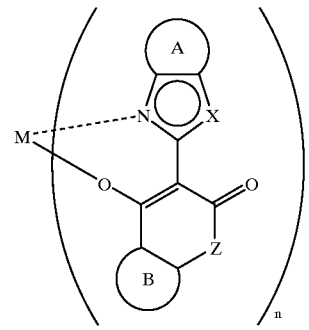

wherein, "X" is, with or without a functional group bonded thereto, one selected from the group consisting of oxygen, sulfur, selenium, and nitrogen;

"Z" is, with or without a functional group bonded thereto, one selected from the group consisting of carbon, oxygen, sulfur, selenium, and nitrogen;

"M" is a metal;

"n" is a positive integer depending upon the oxidation state of the metal "M";

"A" and "B" are substituents comprising one or more ring structures; and implicit hydrogens of Chemical Formula (1) can be substituted with any functional groups.

2. The organometallic complex as defined in claim 1, wherein the "M" is a monovalent, divalent or a trivalent metal, and wherein the "n" equals to 1, 2, or 3.

3. The organometallic complex as defined in claim 2, wherein the "M" is selected from the group consisting of lithium, beryllium, zinc, magnesium, gallium, indium and aluminum.

4. The organometallic complex as defined in claim 3, wherein the "M" is lithium or zinc.

5. The organometallic complex as defined in claim 1, wherein the complex comprises the structure:

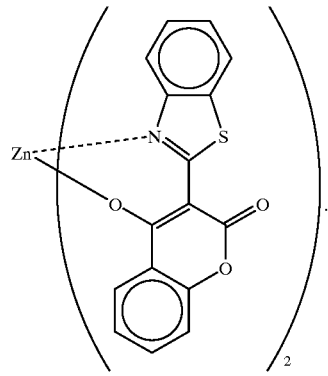

6. The organometallic complex as defined in claim 1, wherein the complex comprises the structure:

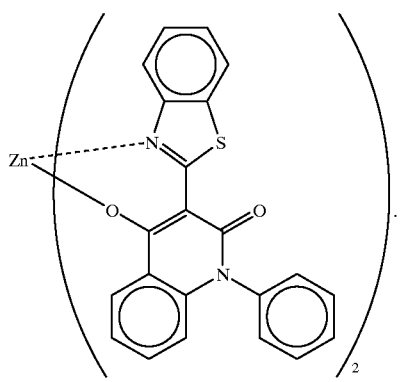

7. The organometallic complex as defined in claim 1, wherein the complex comprises the structure:

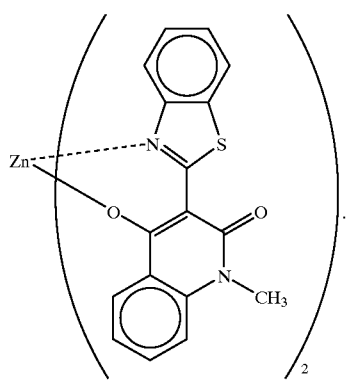

8. An organometallic complex comprising the structure:

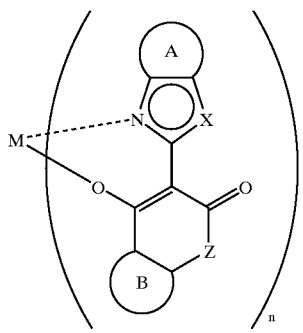

wherein, "X" is, with or without a functional group bonded thereto, one selected from the group consisting of carbon, oxygen, sulfur, selenium, and nitrogen;

"Z" is, with or without a functional group bonded thereto, one selected from the group consisting of carbon, oxygen, sulfur, selenium, and nitrogen;

"M" is a metal;

"n" is a positive integer depending upon the oxidation state of the metal "M";

"A" and "B" are substituent groups comprising one or more ring structures; and implicit hydrogens of Chemical Formula (1) can be substituted with any functional groups;

wherein the ring "A" is selected from the group consisting of the following rings:

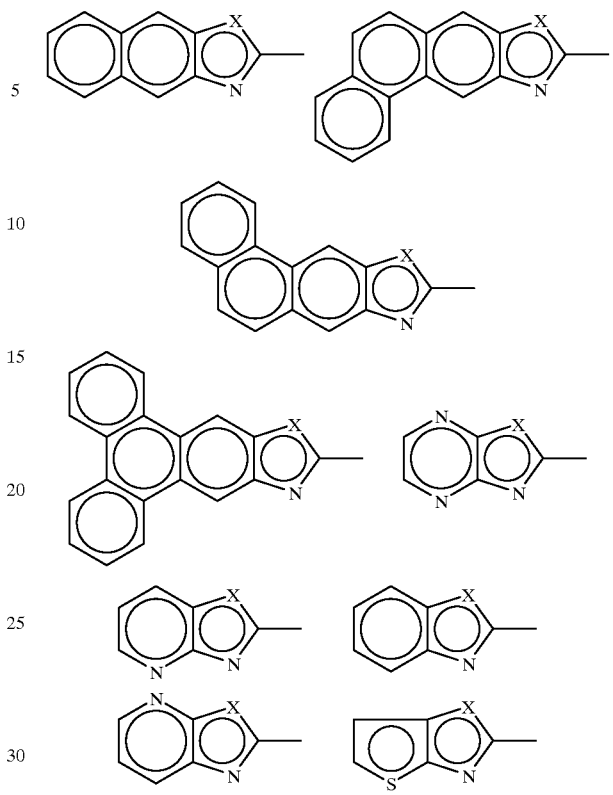

wherein the rings are shown together with the pentagonal ring having N and "X".

9. An organometallic complex comprising the structure:

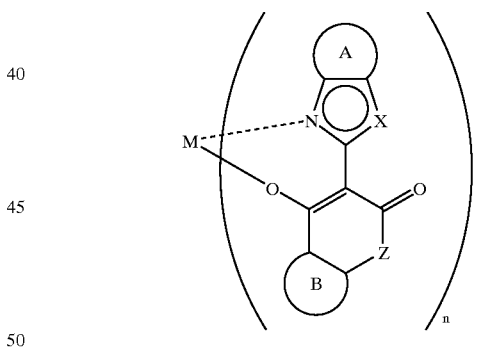

wherein, "X" is, with or without a functional group bonded thereto, one selected from the group consisting of carbon, oxygen, sulfur, selenium, and nitrogen;

"Z" is, with or without a functional group bonded thereto, one selected from the group consisting of carbon, oxygen, sulfur, selenium, and nitrogen;

"M" is a metal;

"n" is a positive integer depending upon the oxidation state of the metal "M";

"A" and "B" are substituent groups comprising one or more ring structures; and implicit hydrogens of Chemical Formula (1) can be substituted with any functional groups;

wherein the ring "B" is selected from the group consisting of the following rings:

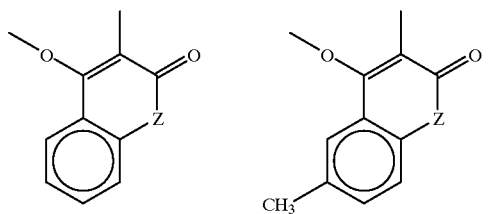
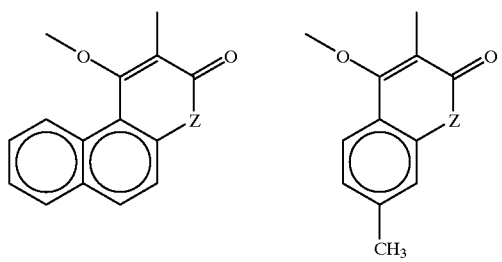
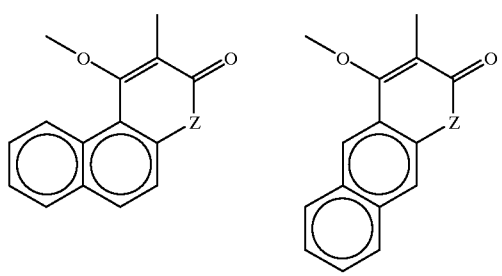
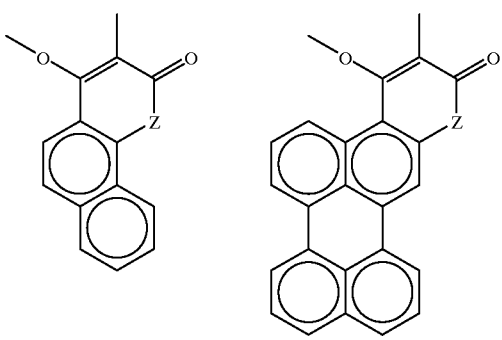
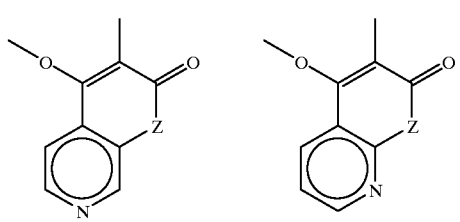

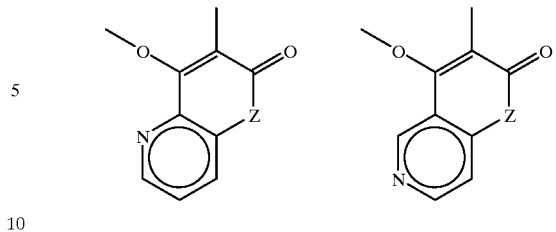

wherein the rings are shown together with the hexagonal ring with "Z".

10. A light-emitting composition, comprising an organometallic complex and a fluorescent compound, wherein the organometallic complex comprises the structure:

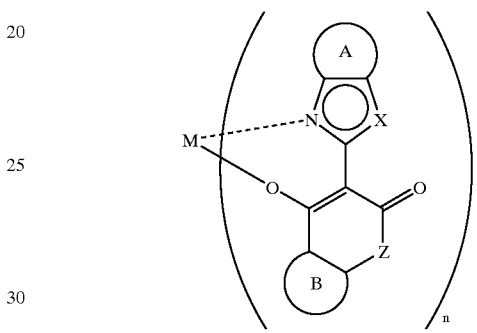

wherein, "X" is, with or without a functional group bonded thereto, one selected from the group consisting of carbon, oxygen, sulfur, selenium, and nitrogen;

"Z" is, with or without a functional group bonded thereto, one selected from the group consisting of carbon, oxygen, sulfur, selenium, and nitrogen;

"M" is a metal;

"n" is a positive integer depending upon the oxidation state of the metal "M";

"A" and "B" are substituent groups comprising one or more ring structures; and implicit hydrogens of Chemical Formula (1) can be substituted with any functional groups.

11. The light-emitting composition as defined in claim 10, wherein the organometallic complex has a band gap corresponding to blue light emission.

12. The light-emitting composition as defined in claim 10, wherein the fluorescent compound has a band gap smaller than a band gap of the organometallic complex.

13. The light-emitting composition as defined in claim 12, wherein the fluorescent compound comprises at least one selected from the group consisting of perylene, rubrene, coumarine, quinacridone, nile red, and DCM.

14. An electron-transporting composition, comprising the organometallic complex defined in claim 1.

15. The electron-transporting composition as defined in claim 14, further comprising a light-emitting material.

16. The electron-transporting composition as defined in claim 15, wherein the light emitting material comprises Alq3 or perylene.

17. An organic EL device, comprising:
a first electrode;
a second electrode opposing the first electrode; and
at least one layer located between the first electrode and the second electrode, the at least one layer containing an organometallic complex comprising the structure:

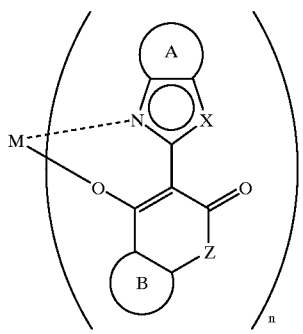

wherein, "X" is, with or without a functional group bonded thereto, one selected from the group consisting of carbon, oxygen, sulfur, selenium, and nitrogen;

"Z" is, with or without a functional group bonded thereto, one selected from the group consisting of carbon, oxygen, sulfur, selenium, and nitrogen;

"M" is a metal;

"n" is a positive integer depending upon the oxidation state of the metal "M";

"A" and "B" are substituent groups comprising one or more ring structures; and implicit hydrogens of Chemical Formula (1) can be substituted with any functional groups.

18. The organic EL device as defined in claim 17, wherein the organic EL device is supported by a transparent substrate.

19. The organic EL device as defined in claim 17, wherein the substrate contacts with the second electrode, and the second electrode is transparent.

20. The organic EL device as defined in claim 17, wherein the at least one layer comprises a light-emitting layer.

21. The organic EL device as defined in claim 20, wherein the light-emitting layer further contains a fluorescent material.

22. The organic EL device as defined in claim 21, wherein the fluorescent material comprises perylene.

23. The organic EL device as defined in claim 21, wherein the fluorescent material is distributed in the first layer toward the second electrode.

24. The organic EL device as defined in claim 17, wherein the at least one layer comprises a first layer and a second layer, wherein the first layer contains the organometallic complex, and wherein the second layer is located between the first layer and the second electrode.

25. The organic EL device as defined in claim 24, wherein the first layer further contains a fluorescent material.

26. The organic EL device as defined in claim 25, wherein the fluorescent material has a band gap smaller than a band gap of the organometallic complex.

27. The organic EL device as defined in claim 25, wherein the fluorescent material comprises Alq3 or perylene.

28. The organic EL device as defined in claim 24, wherein the second layer contains a hole-transporting material.

29. The organic EL device as defined in claim 28, wherein the second layer further contains a fluorescent material.

30. The organic EL device as defined in claim 24, wherein the at least one layer further comprises a third layer between the first and second layers, wherein the third layer contains a fluorescent material.

31. The organic EL device as defined in claim 17, wherein the first layer directly contacts the first electrode.

32. An electronic device comprising a display, the display comprising the organic EL device of claim 17.

33. A method of generating visible light from the organic EL device of claim 17, comprising:

injecting electrons and holes from the two opposing first and second electrodes into at least one layer located between the two electrodes by applying electric power to the two electrodes, wherein the at least one layer contains the organometallic complex;

allowing electrons and holes to recombine within the at least one layer, thereby generating visible light.

34. The method as defined in claim 33, wherein the at least one layer comprises an electron-transporting layer and a hole-transporting layer, wherein the organometallic complex is contained in the electron-transporting layer.

35. The method as defined in claim 34, wherein the electron-transporting layer further contains a fluorescent material having a higher quantum yield than the organometallic complex, whereby generating the visible light at the electron-transporting layer.

36. The method as defined in claim 34, wherein the hole-transporting layer contains a fluorescent material, whereby generating the visible light at the hole-transporting layer.

37. A method of manufacturing the organic EL device of claim 17, the method comprising:

providing a substrate;

forming a first conductive layer as the first electrode;

forming at least one layer containing the organometallic complex; and forming a second conductive layer as the second electrode.

38. The method as defined in claim 37, further comprising doping a fluorescent material while forming the at least one layer containing the organometallic complex.

39. The method as defined in claim 38, further comprising forming a layer containing a hole-transporting material.

40. A method of manufacturing an electronic device comprising a display, which comprises the organic EL device of claim 17, the method comprising:

providing a substrate;

forming a first conductive layer as the first electrode;

forming at least one layer containing the organometallic complex; and forming a second conductive layer as the second electrode.

* * * * *